United States Patent [19]

Iijima

[11] 4,352,643
[45] Oct. 5, 1982

[54] STRUCTURE FOR VIBRATION ISOLATION IN AN APPARATUS WITH A VACUUM SYSTEM

[75] Inventor: Nobuo Iijima, Yokohama, Japan

[73] Assignee: Fujitsu Limited, Kawasaki, Japan

[21] Appl. No.: 148,723

[22] Filed: May 12, 1980

[30] Foreign Application Priority Data

May 18, 1979 [JP] Japan ................................. 54/61224

[51] Int. Cl.$^3$ ............................................. F04B 39/00
[52] U.S. Cl. ..................................... 417/313; 62/297; 248/610; 417/363
[58] Field of Search ............... 417/901, 360, 363, 313; 62/55.5, 297, 100, 268, 269; 74/18, 18.1, 18.2; 248/638, 610, 636; 250/442, 443, 441

[56] References Cited

U.S. PATENT DOCUMENTS

| | | | |
|---|---|---|---|
| 1,165,449 | 12/1915 | Rietz | 74/18 X |
| 2,205,831 | 6/1940 | Hartman | 417/363 X |
| 2,496,720 | 2/1950 | Heiman | 417/363 |
| 3,284,148 | 11/1966 | Ramniceanu | 98/115 LH |
| 4,033,140 | 7/1977 | Klee et al. | 62/297 X |

Primary Examiner—Carlton R. Croyle
Assistant Examiner—Edward Look
Attorney, Agent, or Firm—Staas & Halsey

[57] ABSTRACT

An apparatus with a vacuum system, said vacuum system including a vacuum chamber adapted to contain main instruments of the apparatus, and an exhaust device adapted to exhaust air from the vacuum chamber, which apparatus comprises a structure for vibration isolation adapted to prevent the transmission of the vibration of the exhaust device to a main section of the apparatus, the exhaust device of the structure comprising a bellows connected with the vacuum chamber, an exhaust tube connected with the bellows and a vacuum pump attached to the exhaust tube; and the bellows, the exhaust tube and the vacuum pump are arranged to construct a pendulum system in which the bellows is adapted for a fulcrum, whereby the vibrations of the vacuum pump are absorbed by the pendulum system and do not reach the main section of the apparatus. Other structure for providing additional guidance and dampening of the pendulum system may also be provided.

10 Claims, 11 Drawing Figures

STRUCTURE FOR VIBRATION ISOLATION IN AN APPARATUS WITH A VACUUM SYSTEM

BACKGROUND OF THE INVENTION

The present invention relates generally to an apparatus with a vacuum system, such as an electron-beam exposure apparatus, an electron microscope or the like, in which apparatus the vacuum system includes a vacuum chamber adopted to contain main instruments of the apparatus, and the exhaust device adapted to exhaust air from the vacuum chamber, and more particularly to a structure for vibration isolation adapted to prevent the transmission of the vibration of the exhaust device to the main section of the apparatus, which structure is particularly adopted for the apparatus in which the exhaust device comprises a cryopump adopted as an air exhausting pump.

In recent years, as one type of vacuum pump, the cryopump was developed, which is small in size and light in weight and also is excellent in both the air exhausting rate and the attainable degree of the vacuum, and which has been very often adopted as the air exhausting pump for an apparatus with a vacuum system. In the cryopump, however, the generation of a low frequency vibration of about 2–3 [Hz] is unavoidable, due to the construction of the pump. Meanwhile, among various apparatuses with vacuum systems in which the exhaust devices comprise cryopumps, there are some apparatuses which are extremely adversely affected by the vibration, such as an electron-beam exposure apparatus, an electron microscope, or the like. Accordingly, methods have been devised to provide such an apparatus with a system for vibration isolation which utilizes air, rubber, springs or the like. However, such systems for vibration isolation provide for the elimination of vibrations having frequencies of more than several tens [Hz], but do not eliminate low frequency vibrations of 2–3 [Hz].

For the purpose of providing the elimination of such low frequency vibrations, a structure for vibration isolation is proposed, in which the vacuum chamber is connected via a bellows with the cryopump, which is secured to a fixed base, whereby the vibration of the cryopump is absorbed by the bellows. In accordance with this structure, the vibration of the cryopump is absorbed to a relatively great extent. However, this structure requires a bellows having a long length, which is very expensive, costing as much as, or more than, the cryopump.

SUMMARY OF THE INVENTION

It is, therefore, a primary object of the present invention to provide an inexpensive structure for vibration isolation adapted for the apparatus as mentioned above, which structure is adapted to prevent the transmission of the vibration of the cryopump to the main section of the apparatus.

In accordance with the present invention, an apparatus with a vacuum system is achieved, the vacuum system including a vacuum chamber adapted to contain main instruments of the apparatus, and an exhaust device adapted to exhaust air from the vacuum chamber, which apparatus comprises a structure for vibration isolation adapted to prevent the transmission of the vibration of the exhaust device to the main section of the apparatus, in which structure the exhaust device comprises a bellows connected with the vacuum chamber, an exhaust tube connected with the bellows and a vacuum pump attached to the exhaust tube; and the bellows, the exhaust tube and the vacuum pump are arranged to construct a pendulum system in which the bellows is adapted for a fulcrum.

Preferably, the apparatus further comprises guard structure for preventing the bellows from being crushed in the axial direction when the vacuum is produced in the vacuum chamber.

It is also preferable that the apparatus further comprises damper structure adapted to cooperate with the pendulum system for dampining the swing of the pendulum system caused by an external force.

The present invention will become apparent from the following description of the preferred embodiments with reference to the accompanying drawings.

BRIEF DESCRIPTION OF THE DRAWINGS

FIGS. 4 and 4A are views similar to FIGS. 3 and 3A, respectively, but illustrating a further embodiment of the structure according to the present invention;

DETAILED DESCRIPTION OF THE INVENTION

Figure 1:
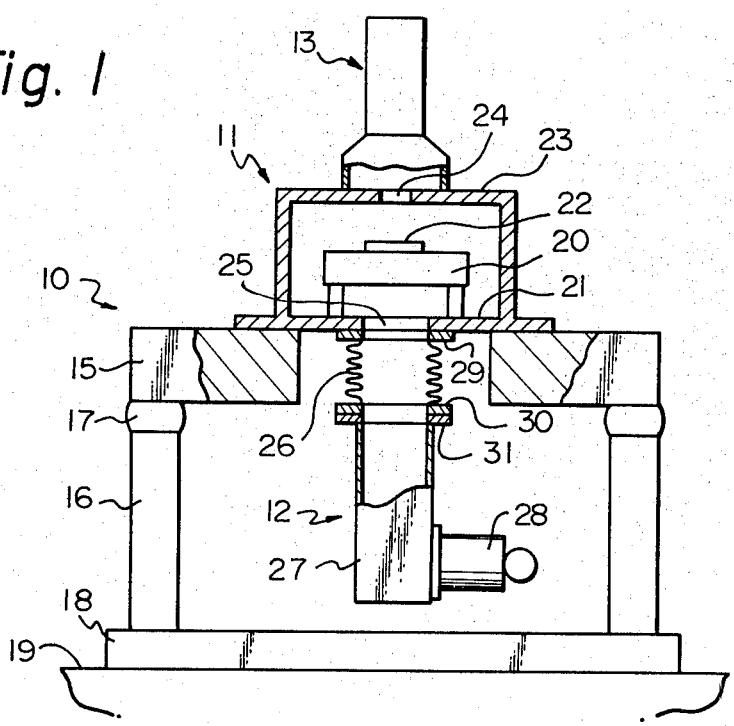
FIG. 1 is a partially sectioned front elevational view diagrammatically illustrating an electron-beam exposure apparatus having a structure for vibration isolation according to the present invention.

Referring to FIG. 1, an electron-beam exposure apparatus is illustrated, which generally comprises a base structure 10, a vacuum chamber 11, an exhaust device 12 and an electron beam generator 13. The base structure 10 comprises a surface plate 15 on which the vacuum chamber 11 is set. The surface plate 15 is supported by support members 16, via vibration insulators 17 which are formed of an elastic material, such as rubber, for example. The support members 16 are secured to a base plate 18, which is fixed to a floor 19.

The vacuum chamber 11 contains therein an adjustable table 20, which is mounted on the bottom 21 of the chamber and onto which a piece of material 22 is set that is to be exposured to an electron beam. The electron beam generator 13 is mounted on the top 23 of the chamber 11, and an electron beam (not illustrated) is applied onto the material 22 through an opening 24 formed in the chamber top 23. The electron beam generator 13 is provided therein with an electron source (electron gun), an electron beam blanking unit, and an electron beam deflection unit or the like (not illustrated).

The exhaust device 12 is provided for exhausting air from the inner space of the chamber 11 so as to produce a high degree of vacuum in the chamber. The exhaust device 12 generally comprises a bellows 26, an exhaust tube 27 and a cryopump 28. The bellows 26 has connecting flanges 29 and 30 at the opposed ends, and is connected at the upper flange 29 with the bottom 21 of the chamber 11. The bellows 26 is in communication with the inner space of the chamber 11, via an opening 25 formed in the chamber bottom 21. The exhaust tube 27 is in the form of a metal pipe having a closed bottom end, and has an upper flange 31 which is connected with the bellows 26. The cryopump 28 is attached to a side of the lower portion of the exhaust tube 27, whereby air in the inner space of the chamber 11 is exhausted via the opening 25, the bellows 26, the exhaust tube 27 and the cryopump 28.

Figure 1A:
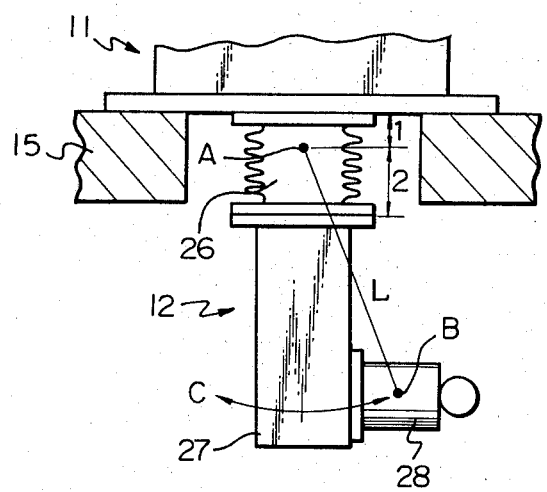
FIG. 1A is an enlarged view illustrating chiefly the exhaust device of the apparatus illustrated in FIG. 1.

In the structure mentioned above, the exhaust device 12, that is, the bellows 26, the exhaust tube 27 and the cryopump 28 are suspended from the vacuum chamber 11 and construct a pendulum system in which the bellows 26 is adapted for a fulcrum. As illustrated in FIG. 1A, the fulcrum of the pendulum system corresponds to a point A which divides the length of the bellows 26 in the ratio of appropriately 1:2. When a vibration is produced by a reciprocal motion of a piston of cryopump 28, the pendulum system swings about the fulcrum A in the direction C. It can be considered that the gravity centre of the pendulum system is substantailly the gravity centre B of the cryopump 28, because the weight of the exhaust tube 27 is relatively lighter than that of the cryopump 28, and, accordingly, the distance between the points A and B is the length of pendulum L [cm]. A characteristic frequency $f_n$ of this pendulum system is represented by the following expression.

$$f_n \approx 1/2\pi \sqrt{g/L} \text{ [Hz]}$$

If the length L is 50 [cm], for example, the characteristic frequency $f_n$ is about 0.7 [Hz], which is relatively smaller than the frequency 2–3 [Hz] of the vibration of the cryopump 28. In this case, if the cryopump 28 produces the vibration, the pendulum system cannot follow this vibration; that is, the pendulum system substantially cannot swing. Therefore, the vibration of the cryopump 28 is absorbed by the pendulum system, and is not transmitted to the main section of the apparatus, which includes the vacuum chamber 11 and the instruments associated with the vauum chamber.

Meanwhile, the vibration of the cryopump in the vertical direction has a relatively high frequency of more than 10 [Hz], and, accordingly, this vibration can be effectively absorbed by the axial flexibility of the bellows 26 without transmission thereof to the main section of the apparatus.

As described above, in the structure for vibration isolation according to the present invention, the pendulum system absorbs the vibration of the cryopump, thereby preventing the vibration from being transmitted to the main section of the apparatus, such as, the electron-beam exposure apparatus, the electron microscope or the like. Furthermore, the structure for vibration isolation according to the present invention permits a relatively short length of bellows to be used, thereby providing a great savings in expense.

Referring to FIGS. 2 through 5A, illustrated are further embodiments of the structure according to the present invention, in which the exhaust device 12 has the same construction as described with reference to FIGS. 1 and 1A, but which further comprise various guard systems adapted for preventing the bellows 26 from being crushed in the axial direction when the vacuum is produced in the vacuum chamber 11.

Figure 2:
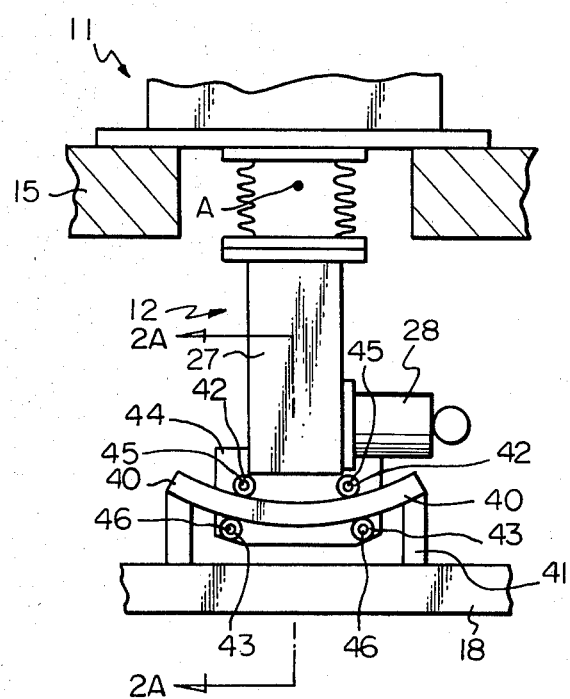
FIG. 2 is a view similar to FIG. 1A, but illustrating another embodiment of the structure according to the present invention.
Figure 2A:
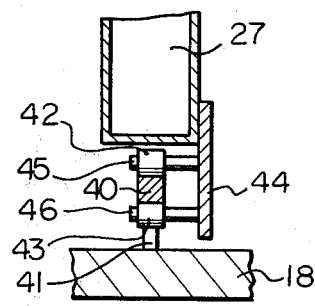
FIG. 2A is a sectional view taken along line 2A—2A in FIG. 2.

The guard system illustrated in FIGS. 2 and 2A, comprises an arcuate guide rail 40 which is secured to the base plate 18, by means of supports 41, and two pairs of rollers 42 and 43 which are carried by axles 45 and 46 which are, in turn, secured to the exhaust tube 27, by means of a board 44. The guide rail 40 extends about the fulcrum A and in the direction C (refer to FIG. 1A) of the swing of the pendulum system. The rollers 42 and 43 are arranged so that the longitudinal axes thereof are perpendicular to the plane of the drawing in FIG. 2 and the guide rail 40 is disposed between the upper rollers 42 and the lower rollers 43, whereby the pendulum system is guided by the guide rail 40 to swing about the fulcrum A. When the vacuum is produced in the inner space of the vacuum chamber 11 and, accordingly, the exhaust tube 27 is subjected to an upward force, the lower rollers 43 abut on the lower surface of the guide rail 40, thereby preventing the bellows 26 from being crushed. In this guard system, the guide rail 40 may have a linear form, instead of the arcuate form. It is also possible to exclude the lower rollers 43, provided that the exhaust device 12 has a weight greater than the upward force acting thereon.

Figure 3:
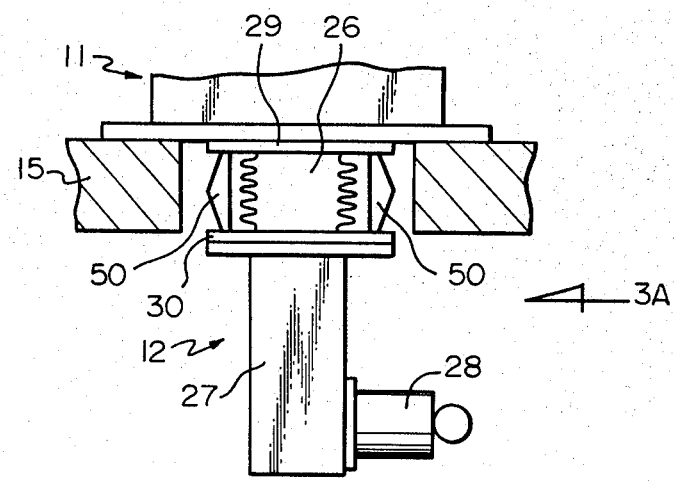
FIG. 3 is a view similar to FIG. 2, but illustrating a still another embodiment of the structure according to the present invention.
Figure 3A:
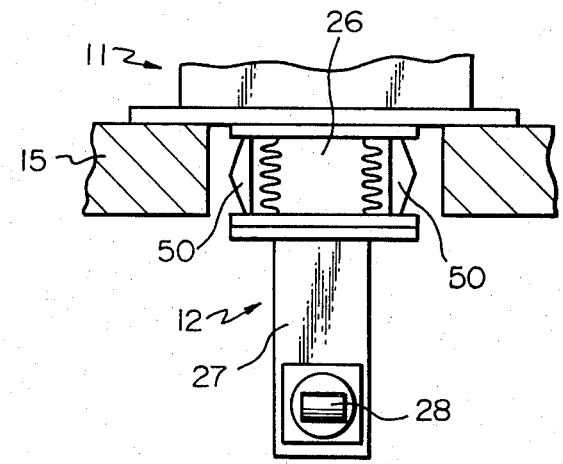
FIG. 3A is a side view taken along arrow 3A in FIG. 3.

The guard system illustrated in FIGS. 3 and 3A, comprises elastic packing members 50, which are formed of rubber, for example. The packing members 50 are inserted between the upper and lower flanges 29 and 30 of the bellows 26 and are adapted for allowing the swing of the pendulum system, while preventing the bellows 26 from being crushed.

Figure 4:
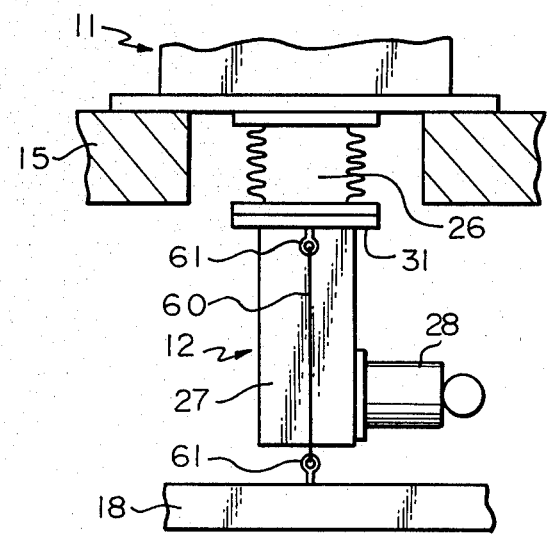
Figure 4:
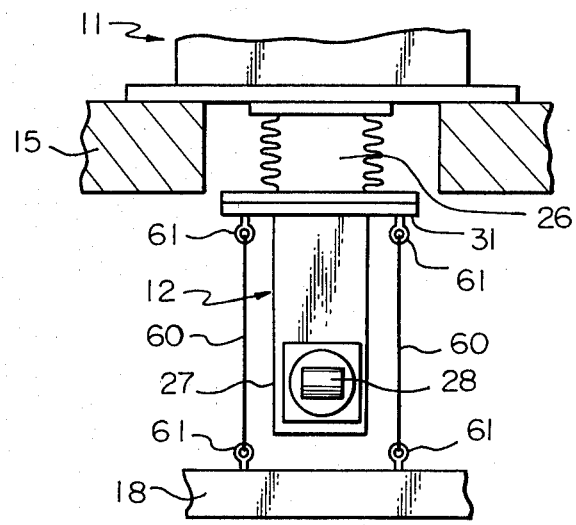

The guard system illustrated in FIGS. 4 and 4A, comprises a pair of tension members 60, each of which is in the form of a wire, rod or the like. Each tension member 60 is connected, at the upper end thereof, with the upper flange 31 of the exhaust tube 27 and, at the lower end thereof, with the base plate 18, by means of elements 61, such as eye bolt, for example. These tension members 60 are adapted for allowing the swing of the pendulum system, while preventing the bellows from being crushed.

Figure 5:
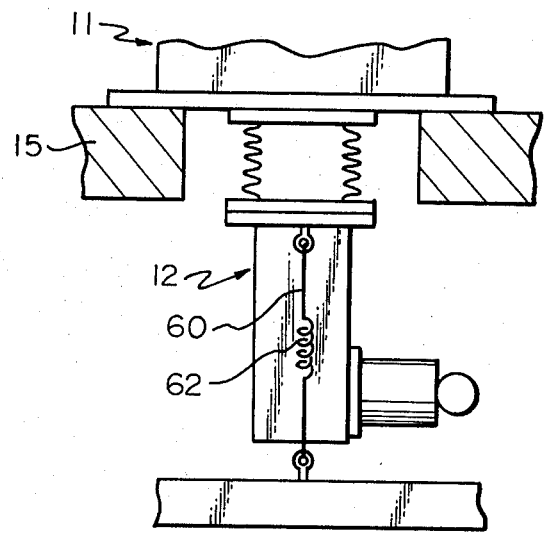
FIGS. 5 and 5A are views similar to FIGS. 4 and 4A, respectively, but illustrating a variation of the embodiment illustrated in FIGS. 4 and 4A.
Figure 5A:
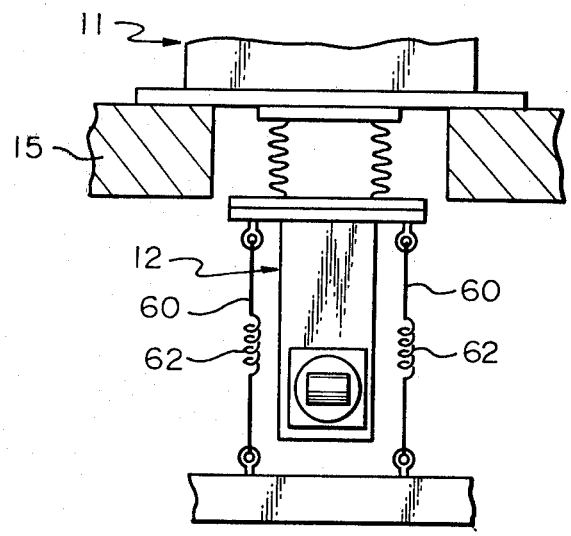

FIGS. 5 and 5A illustrate a variation of the guard system illustrated in FIGS. 4 and 4A. In this variation, the tension member 60 is incorporated with an elastic element 62, which is in the form of a spring, as illustrated, a rubber material or the like. These additional elastic elements 62 provide for a reduction in resonant frequency of the pendulum system and, accordingly, a more effective vibration isolation, in comparison with the embodiment illustrated in FIGS. 4 and 4A.

Figure 6:
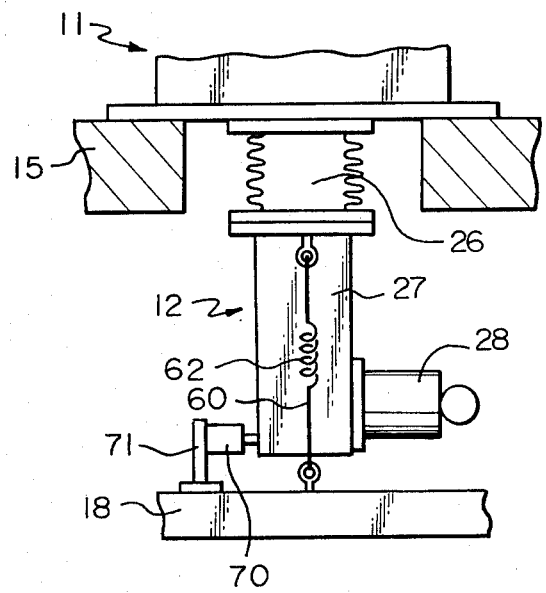
FIG. 6 is a view similar to FIG. 3, but illustrating a still further embodiment of the structure according to the present invention.

Referring to FIG. 6, illustrated is a still further embodiment of the structure according to the present invention, which has basically the same structure as illustrated in FIGS. 5 and 5A, but which further comprises a damper system adapted for damping the swing of the pendulum system caused by an external force. The damper system comprises a damper element 70, which is formed of an elastic material such as rubber, for example. The damper element 70 is secured to the base plate 18, by means of a support 71, so that, when the exhaust device 12, i.e. the pendulum system, is energized to swing by an external force other than the vibration of the cryopump, the lower portion of the exhaust tube 27 abuts on the damper element 70, whereby any unexpected injurious swing of the pendulum system can be effectively damped in a short period of time.

The damper system described above may be applied to not only the embodiment in FIGS. 5 and 5A, but also the other embodiments described hereinbefore.

It should be understood that the present invention may be applied to various apparatus with the vacuum system, such as, the electron-beam exposure apparatus, the electron microscope, a vacuum evaporator, a sputtering apparatus or the like.

form of a pendulum in which the bellows is used as a fulcrum.

2. An apparatus according to claim 1, wherein said vacuum pump is a cryopump.

3. An apparatus according to claim 1, further comprising guard means for preventing said bellows from being crushed in the axial direction when the vacuum is produced in said vacuum chamber.

4. An apparatus according to claim 3, wherein said guard means comprises a guide rail secured to a fixed base member of the apparatus and extending in the direction of the swing of said pendulum, and rollers

UNITED STATES PATENT AND TRADEMARK OFFICE
CERTIFICATE OF CORRECTION

PATENT NO. : 4,352,643
DATED : October 5, 1982
INVENTOR(S) : Nobuo Iijima

It is certified that error appears in the above-identified patent and that said Letters Patent is hereby corrected as shown below:

Column 2, line 12, "dampining" should be --dampening--.

Signed and Sealed this

Twenty-second Day of February 1983

[SEAL]

Attest:

GERALD J. MOSSINGHOFF

Attesting Officer

Commissioner of Patents and Trademarks